(12) United States Patent
Peters et al.

(10) Patent No.: US 9,318,672 B2
(45) Date of Patent: Apr. 19, 2016

(54) LEADFRAME LED LIGHTING ASSEMBLY

(75) Inventors: Ralph Hubert Peters, Aachen (DE); Nils Benter, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/809,014

(22) PCT Filed: Jul. 4, 2011

(86) PCT No.: PCT/IB2011/052946
§ 371 (c)(1),
(2), (4) Date: Jan. 8, 2013

(87) PCT Pub. No.: WO2012/004724
PCT Pub. Date: Jan. 12, 2012

(65) Prior Publication Data
US 2013/0105832 A1  May 2, 2013

(30) Foreign Application Priority Data
Jul. 8, 2010  (EP) .................................... 10168798

(51) Int. Cl.
| | |
|---|---|
| H01L 27/15 | (2006.01) |
| H01L 33/60 | (2010.01) |
| H01L 33/62 | (2010.01) |
| F21S 8/10 | (2006.01) |
| F21Y 101/02 | (2006.01) |

(52) U.S. Cl.
CPC ............. *H01L 33/60* (2013.01); *F21S 48/1109* (2013.01); *F21S 48/1154* (2013.01); *F21S 48/1159* (2013.01); *F21S 48/1317* (2013.01); *F21S 48/215* (2013.01); *H01L 27/15* (2013.01); *H01L 33/62* (2013.01); *F21S 48/1388* (2013.01); *F21S 48/212* (2013.01); *F21Y 2101/02* (2013.01)

(58) Field of Classification Search
None
See application file for complete search history.

(56) References Cited

U.S. PATENT DOCUMENTS

| | | | |
|---|---|---|---|
| 4,593,485 A | 6/1986 | Thillays | |
| 5,119,174 A | 6/1992 | Chen | |
| 6,331,063 B1 * | 12/2001 | Kamada et al. | ............... 362/237 |

(Continued)

FOREIGN PATENT DOCUMENTS

| | | |
|---|---|---|
| CN | 1464953 A | 12/2003 |
| EP | 0127239 A1 | 12/1984 |

(Continued)

OTHER PUBLICATIONS

Weaver et al ("Optical Properties of Selected Elements", pp. 12-126 through 12-150, in Handbook of Chemistry and Physics, 94th Edition, 2013-2014.*

(Continued)

*Primary Examiner* — Johannes P Mondt

(57) ABSTRACT

A lighting assembly and a lamp for a motor vehicle are described. A leadframe 14 out of a metal sheet material comprises a first part 14c and a second part 14b not directly electrically connected. An LED element 16 is fixed to the leadframe 14. A first contact part 24a is connected to the first leadframe part 14c and a second contact part 24b is connected to the second leadframe part 14b. The LED element 16 is disposed to emit light when operated. In order to achieve a desired directed emission of light in a simple way, the leadframe 14 comprises a light direction section 20a,20b including a reflective surface 30a,30b arrange to reflect the light emitted from the LED element 16.

11 Claims, 2 Drawing Sheets

(56) References Cited

U.S. PATENT DOCUMENTS

| | | | |
|---|---|---|---|
| 6,595,671 B2 | 7/2003 | Lefebvre et al. | |
| 6,995,402 B2 | 2/2006 | Ludowise et al. | |
| 2005/0168156 A1* | 8/2005 | Li et al. | 315/185 R |
| 2005/0287843 A1 | 12/2005 | Tsukamoto | |
| 2006/0131601 A1* | 6/2006 | Ouderkirk et al. | 257/99 |

FOREIGN PATENT DOCUMENTS

| | | |
|---|---|---|
| EP | 0921568 A2 | 6/1999 |
| EP | 1298383 A2 | 4/2003 |
| EP | 2052909 A2 | 2/2008 |
| JP | 59228690 A | 12/1984 |
| JP | 5316296 A | 11/1993 |
| JP | 2006013018 A | 1/2006 |
| JP | 2007184541 A | 7/2007 |
| JP | 2009032851 A | 2/2009 |
| JP | 2009231228 A | 10/2009 |
| JP | 2009246407 A | 10/2009 |
| WO | 2006016398 A | 2/2006 |
| WO | 2010058904 A2 | 5/2010 |

OTHER PUBLICATIONS

Hammond, C.R., "The Elements", in Handbook of Chemistry and Physics, 94th Edition, 2013-2014.*
J.W. Stewart; Entitled: "HP Snapled: LED Assemblies for Automotive Signal Lighting" The Hewlett-Packard Journal an Online Publication http://www.hp.com/hpy/journal.html, vol. 50, No. 1., Article 1, Nov. 1, 1998. pp. 1-12.
EPO as ISA, PCT/IB2011/052946, filed Jul. 4, 2011, "International Search Report and Written Opinion" dated Dec. 13, 2011, 10 pages.
First Office Action issued Nov. 3, 2014 from Chinese Patent Application No. 201180033919.5.
Second Office Action issued Jun. 1, 2015 from Chinese Patent Application No. 201180033919.5.
Third Office Action issued Sep. 14, 2015 from Chinese Patent Application No. 201180033919.5.
Fourth Office Action issued Dec. 10, 2015 from Chinese Patent Application No. 201180033919.5.
Office Action mailed Feb. 23, 2015 from Japanese Patent Application No. 2013-517652.

* cited by examiner

LEADFRAME LED LIGHTING ASSEMBLY

TECHNICAL FIELD

The present invention relates to a lighting assembly and a lamp for a motor vehicle. In particular, the invention relates to a lighting assembly including one or more LED elements mounted on a leadframe out of a metal sheet material.

BACKGROUND ART

LED (light emitting diode) lighting is increasingly used today especially in automotive applications. Especially automotive signaling lamps, such as tail lamps, turn lamps and stop lamps, commonly referred to as rear combination lamps (RCL) and daytime running lamps (DRL) are today realized with a plurality of LED elements.

LED elements require mechanically stable mounting, electrical connection and heat dissipation. These functions are especially well fulfilled by clinch frame technology. In an article "HP SnapLED: LED assemblies for automotive signal lighting" in The Hewlett-Packard Journal Volume 50, Number 1, Article 1, Nov. 1, 1998 by James Stewart this technology is explained. A clinch frame is manufactured from a flat metal sheet material (copper alloy with tin alloy plating). LED elements, termed SnapLED are mounted on the clinch frame by a clinching operation, which is a method for mechanically joining two metal sheets by deforming the sheet material between opposing tools, a punch and an anvil. The LED elements may thus be arranged in an array on the leadframe, which subsequently may be formed by bending the leadframe material to a desired shape conforming to the geometry of the vehicle.

However, in present lighting assemblies using LEDs, optical functionality, i. e. the forming of a desired beam shape of the light emitted from the LED elements is generally achieved by separate optical elements, such as e. g. parts of the LED packaging serving as lenses etc.

DISCLOSURE OF INVENTION

It is an object of the present invention to propose a lighting assembly and a lamp for a motor vehicle where a desired optical result is achieved in an easy way.

SUMMARY OF THE INVENTION

This object is achieved by a lighting assembly according to claim 1 and a lamp according to claim 14. Dependent claims refer to preferred embodiments of the invention.

According to the invention, a lighting assembly includes a leadframe, which in the preferred case of clinch connections may also be referred to as a clinch frame. The leadframe comprises at least two not directly electrically connected parts of a metal sheet material which may be cut or stamped to form edges of a desired shape, and which may also be bent out of the sheet plane. The metal sheet material of the leadframe may be any metal material of sufficient mechanical stability and electrical conductivity. The thickness of the metal sheet material may be e. g. 0.1-0.8 mm, preferably 0.2-0.6 mm, most preferred 0.3-0.4 mm. The sheet material may be comprised of a body material, such as copper or an alloy comprising at least 50% copper and a plating applied thereon, e. g. out of Sn, Ag or Al or an alloy comprising at least 50% of at least one of these metals.

At least one LED element is fixed to the leadframe. The LED element, which may be any type of solid state lighting element, such as semiconductor LED, OLED, or arrays of such elements, comprises a packaging with at least a first and a second contact part. The LED element is fixed to the leadframe by these contact parts, such that both a mechanical mounting and electrical connection is achieved. This connection may in principle be achieved in a plurality of different ways, such as conductive gluing, (laser) welding, soldering etc., but is preferably done by clinching, i. e. where the contact parts have plane contact surfaces which are arranged flat on the first and second parts of the leadframe, and where a connection is formed by a mechanical deformation of the flat material, especially preferred in a form fit (clinch) connection.

The LED element emits light when operated by applying electrical power to the contact parts. The shape of the resulting beam of light may depend on optically active parts of the LED packaging, such as reflective surfaces or lens-like elements that form part of the packaging of the LED element.

According to the invention, the leadframe, besides providing mechanical mounting and electrical connection as well as thermal management, also serves an optical function in the lighting assembly. To this end, the leadframe comprises at least one light direction section, i. e. a section of the leadframe that serves to direct at least a portion of the light emitted from the LED element and therefore aids to achieve a desired emitted beam form. The light direction section includes a reflective surface arranged to reflect at least a portion of the light emitted from the LED element.

For this optical function, the reflective surface may have different reflective properties. In order to obtain a maximum reflected intensity, a specular reflective optical property of the reflective surface with a reflectivity (reflected intensity divided by original intensity) of above 70% is preferred. Alternatively, the surface may be diffusely reflective with a reflectivity of preferably above 50%. Alternatively or in combination herewith the surface may be colored, e. g. in red, yellow or blue color to obtain a desired aesthetical effect even with the LED element turned off, and to obtain reflected light of a desired particular color if the LED element is turned on.

Thus, the lighting assembly according to the invention is of simple construction and has the full flexibility of a leadframe, and especially clinch frame, assembly, i. e. may be shaped and bent to conform to any desired shape, including three-dimensional shapes. Additionally, the resulting beam is formed in an advantageous way, such that e. g. parts of the light generated from the LED element which otherwise would be emitted in unwanted directions, are re-directed into desired directions to form part of a desired emission beam. As the leadframe, which already is an integral part of the lighting assembly, is used for this optical function, the structure of the lighting assembly remains very simple with a low part count, so that manufacture is easy and inexpensive.

Preferably, the light direction section is formed by bending the sheet metal material of the leadframe. For example the first and/or the second part of the leadframe may be bent to form the light direction section. Additionally or alternatively, other parts of the leadframe, also comprised of the sheet metal material thereof, may be used to form the light direction section. In a preferred embodiment, reflective surfaces that redirect incident light from the LED element may be arranged on opposite sites of the LED element.

While generally the light direction section may be formed such that only small portions of the emitted light are reflected at the reflective surfaces, it is preferred that a substantial portion of the light emitted from the LED element is reflected at the reflective surfaces. The portion of the light reflected (measured in percent comparing the directions, i. e. angles in which light is emitted directly and reflected) is preferably at least 10%, further preferred above 20%. In some embodiments, the portion of the light emitted indirectly, i. e. after reflection at the reflective surfaces, is even greater than the portion of the light emitted directly, such that a predominantly indirect beam is obtained.

According to a preferred embodiment, the lighting assembly includes a plurality of LED elements which are arranged spaced from each other. The LED elements may e. g. be provided in a line or array arrangement. While generally any shape of such an arrangement including three-dimensional arrangements, is possible, it is preferred to provide at least portions of the leadframe such that a plurality of LED elements are arranged in a plane and are directed at least substantially in the same direction. Further, it is preferred to provide the leadframe not only of a first and a second part, but of more such parts of metal sheet material between which LED elements are provided. Especially preferred plural LED elements are electrically connected in parallel between such parts of the leadframe, and plural parts of the leadframe may be connected in series.

Further, if a plane of the lighting assembly may be defined in that either sections of the first and second parts of the leadframe are arranged at least substantially in such a plane, or that a plurality of LED elements are arranged in such a plane, it is preferred to have the light direction section of the leadframe arranged at an inclined angle to this plane. The shape of the reflective surface may be e. g. flat or gradually bent.

Further preferred, the leadframe may be fixed to a carrier, which carrier is preferably a plastic part and may be manufactured by injection molding. This provides for a mechanically stable arrangement where very flexibly any desired shape may easily be manufactured. The carrier supports at least portions of the leadframe, preferably also the light direction section thereof.

A lighting assembly according to the invention is well suited for use in a vehicle lamp, such as especially a signaling lamp, for example a daytime running lamp (DRL) or a rear combination lamp (RCL).

BRIEF DESCRIPTION OF THE DRAWINGS

The above and other objects, features and advantages of the present invention will become apparent from the following description of preferred embodiments, in which.

DESCRIPTION OF EMBODIMENTS

Figure 1:
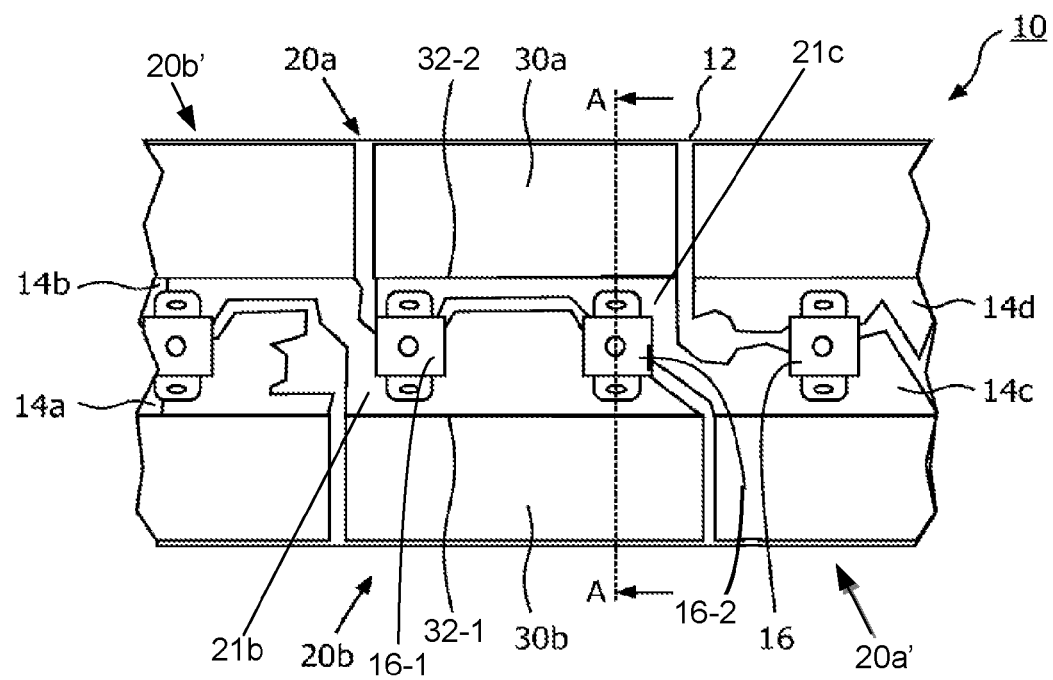
FIG. 1 shows a top view of a part of a lighting assembly according to a first embodiment of the invention.

A first embodiment of a lighting assembly 10 is shown in FIG. 1 as comprising a plastic carrier 12 formed by injection molding, a leadframe 14 fixed thereon which in the shown partial view comprises four separate leadframe parts 14a-14d, and LED elements 16 connected between these leadframe parts 14a-14d. The lighting assembly 10 may serve as a signaling lamp for a motor vehicle, in particular a RCL (Rear Combination Lamp).

The leadframe 14 is a copper alloy sheet metal part of 0.35 mm thickness. The shape of the leadframe 14 including the separation between the parts 14a-14d is stamped out of a flat sheet of this material.

The LED elements 16 are arranged bridging the parts 14a-14d. As visible especially in the exploded view of FIG. 3, each LED element 16 comprises a special packaging including a main body 22 made out of a transparent material enclosing the actual light generating element, i.e. in the preferred embodiment the actual semiconductor LED. Anode and cathode of this LED are each connected to a flat contact tab 24a, 24b. Upon manufacture of the lighting assembly 10, the LED element 16 is placed on the leadframe bridging parts 14b, 14c (FIG. 3) such that the contact tabs 24a, 24b are resting flat on respective flat portions 21b and 21c of the leadframe 14. The LED element 16 is then connected to the parts 14b, 14c of the leadframe 14 by a clinching operation, where from above and below the contact plane corresponding tools (a punch and an anvil) deform jointly the material of the leadframe 14 and of the contact tabs 24a, 24b such that a form fit connection (clinch connection) is established. This connection is mechanically stable due to the form fit, is electrically conductive because of the close contact between the metal contact tabs 24a, 24b and the metal material of the leadframe 14 and provides good heat conduction because of the large contact surface involved between these parts.

In operation of the LED element 16, electrical current is supplied through the parts 14a, 14b, 14c of the leadframe 14. Heat generated in LED element 16 during operation is conducted over contact tabs 24a, 24b to the leadframe 14 and is dissipated there. Due to the large area of the leadframe 14, a substantial amount of heat may be dissipated. It is preferred to provide a leadframe area of more than 300 mm$^2$, further preferred more than 500 mm$^2$ per LED element to provide good heat dissipation.

In the shown embodiment of the invention, the leadframe 14 comprises light direction sections 20a', 20a, 20b', and 20b to direct parts of the light emitted from the LED elements 16 thereby forming a desired beam shape. The light direction sections 20a', 20a, 20b', and 20b are comprised of separate inclined sections integral with the parts 14b, 14c of the leadframe 14. The upper surfaces 30a, 30b of the leadframe 14 in the light direction section 20a, 20b serve as reflective surfaces to reflect portions of the light emitted from LED element 16.

The optical properties of the reflective surfaces 30a, 30b may be chosen as required for the desired beam. For the surfaces 30a, 30b a suitable plating material such as e. g. Sn, Ag or Al may be chosen. (Generally, the whole leadframe 14 will have the same plating material throughout. It is, however, possible to provide a special plating only on the reflective surfaces.) Additionally, the surfaces may be prepared by an appropriate surface processing. A highly reflective coating or special surface processing such as polishing may be employed to obtain high reflectivity. Also, it is possible to coat or process the surfaces 30a, 30b to obtain diffuse reflective properties.

In a first example, the surfaces 30a, 30b have specular reflective properties. The plating of the base material of the leadframe 14 is chosen to be of high optical quality. Al or Ag are preferred here to obtain a reflectivity of more than 70%.

In a second example, diffuse reflective properties of the leadframe surface is desired. The surface is prepared as a plating of Sn material with a predetermined surface roughness to obtain the desired diffuse reflection properties. The reflectivity is still above 50%.

In a further different example, the surface of the leadframe 14, in particular on the reflective surfaces 30a, 30b, is diffusely reflective and coloured. Thus, even if the LED elements 16 are not active, the lighting assembly 10 appears to the observer in the colour that is chosen for the leadframe, e. g. red colour for a signalling lamp. If the LED elements 16 are activated, the light reflected at the reflected surfaces 30a, 30b also appears in the chosen colour.

Figure 2:
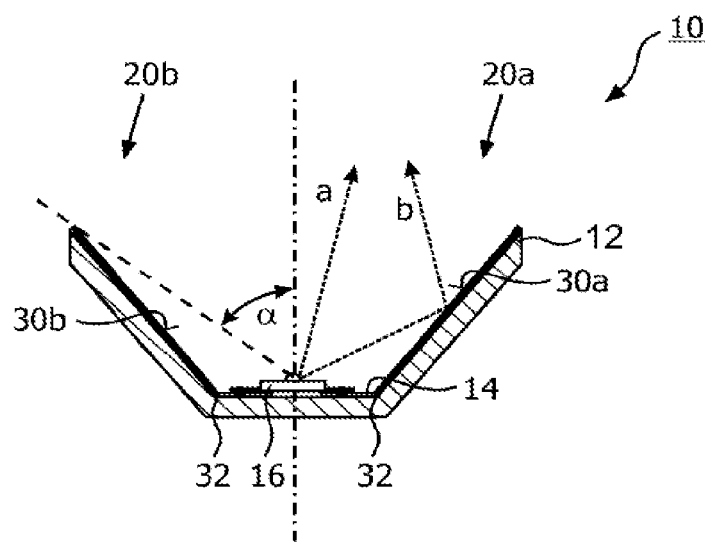
FIG. 2 shows a sectional view of the lighting assembly of FIG. 1 with the section taken along A . . . A.

As shown in FIG. 2, while portions of the light emitted from LED element 16 are emitted directly without reflection at the reflective surfaces 30a, 30b (beam a), there are also portions of the emitted light which strike the reflective surfaces 30a, 30b and are reflected (beam b). This is achieved by positioning the reflective surfaces 30a, 30b of the light direction sections 20a, 20b of the leadframe 14 in the path of these portions of the emitted light by bending the leadframe 14 at bending edges 32-1 and 32-2.

It is preferred that the reflective surfaces 30a, 30b are positioned in the path of substantial portions of the emitted light. In the example shown in FIG. 2, light emitted from the LED element 16 strikes the reflective surfaces 30a, 30b if the emission angle α formed with a vertical axis is above roughly 50°. Thus, if the intensity of the emitted light is equally distributed over 180°, about 40% of the emitted light is reflected at the reflective surfaces 30a, 30b (beam b), whereas the remaining portion (beam a) is emitted directly. As the skilled person will appreciate, the higher the reflective surfaces 30a, 30b are arranged, the higher will be the proportion of reflected light as compared to directly emitted light.

While the center of the leadframe 14 forms a plane, in which the LED element 16, their contact parts and the contacted portions of the parts 14a-14d of the leadframe 14 are arranged, the light direction sections 30a, 30b of the leadframe 14 are arranged at an inclined angle to this plane. While in the present example this angle is shown to be approximately 120° and the reflective surfaces 30a, 30b are shown to be of straight, flat shape, there are of course variations possible depending on the desired resulting beam shape. The bending angle at the bending edges 32 may e. g. vary from 90° to 160°, preferably 110° to 150°. Also, the reflective surfaces 30a, 30b may differ from the straight shape shown in FIGS. 1-3 and may e. g. be curved or gradually bent (not shown).

As shown in FIG. 1, the separate parts 14a-14d of the leadframe 14 are not directly electrically connected to each other. An electrical connection between the parts is formed only by the LED elements 16. Here, plural LED elements 16-1, 16-2, . . . , separated from each other in a longitudinal direction may be arranged in a parallel connection between two leadframe parts 14b, 14c as shown in FIG. 1. Further, a series connection of leadframe parts 14a-14d may be provided.

Figure 3:
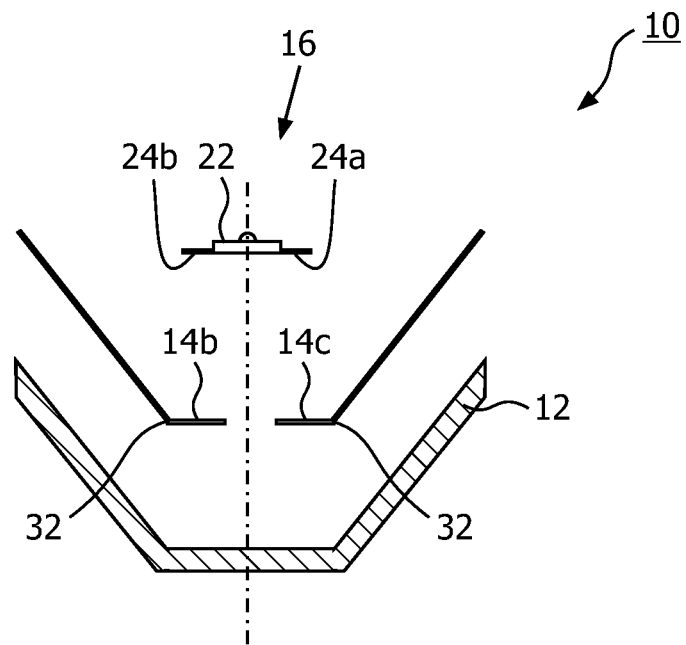
FIG. 3 shows an exploded sectional view of the lighting assembly of FIG. 1, 2 with the section taken along line A . . . A in FIG. 1.

The leadframe 14 and LED elements 16 are mounted on a carrier 12 made out of plastic. The carrier 12 has a shape corresponding to the required mounting space. As shown in FIGS. 1-3, the leadframe 14 is mounted flat on the surface of the carrier 12 not only in the basic plane where the LED elements 16 are arranged but also in the light direction sections 20a, 20b. The leadframe 14 may be fixed to the carrier 12 e. g. by hot stacking, gluing, or by mechanical means such as clamping or screwing. The carrier 12 thus supports the leadframe structure.

Figure 4:
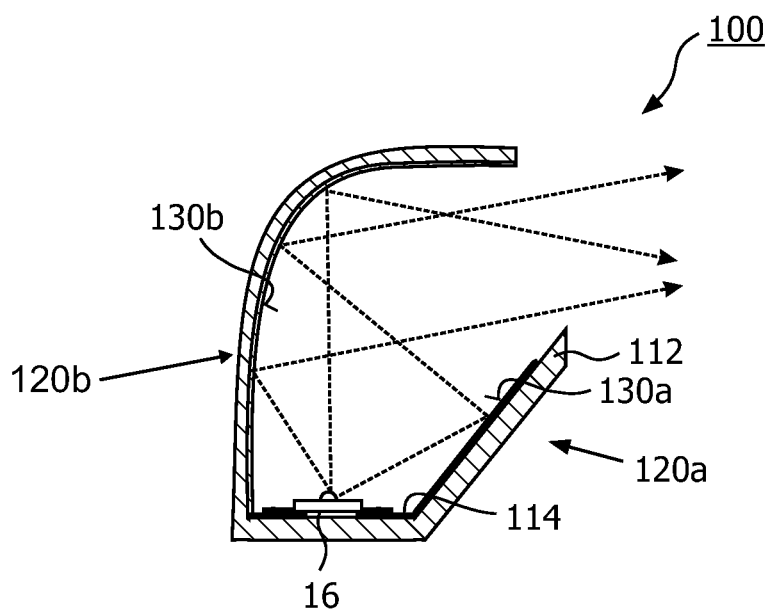
FIG. 4 shows a sectional view of a lighting assembly according to a second embodiment of the invention.

FIG. 4 shows a second embodiment of a lighting assembly 100 in a sectional view. This lighting assembly 100 corresponds in many parts to the lighting assembly 10 according to the first embodiment. A plastic carrier 112 formed by injection moulding carries a leadframe 114 fixed thereon. An LED element 16 is clinched to the leadframe 114.

As in the first embodiment, the leadframe 114 comprises several leadframe parts (not shown), between which several LED elements 16 are arranged. The lighting assembly 100 according to the second embodiment differs from the first embodiment by the shape of the leadframe 114 and the carrier 112. While a first light direction section 120a with a reflective surface 130a is shaped, like in the first embodiment, as a plane arranged under a bending angle of about 125°, the other, opposite light direction section 120b with an inner reflective surface 130b is shaped in a bent shape partly covering the LED element 16. Thus, as shown in FIG. 4, the light emitted from LED element 16 is predominantly emitted indirectly, while only a substantially smaller portion is emitted directly. Some beams are reflected once at the reflective surface 130b, others are even double reflected at both reflective surfaces 130a, 130b. The leadframe 114 is thus shaped to obtain a defined optical result, namely a strongly directed, predominantly indirectly formed beam.

The invention has been illustrated and described in detail in the drawings and foregoing description. Such illustration and description are to be considered illustrative or exemplary and not restrictive; the invention is not limited to the disclosed embodiments. As the skilled person will appreciate, there are various alternatives to the disclosed embodiments.

For example, while the LED elements 16 shown in FIG. 1 are arranged in a line, it is also possible to arrange LED elements in a two dimensional array. Further, as discussed, the shape of leadframe parts 14 as well as of the reflective surfaces 30a, 30b may vary according to the desired electrical connection and depending on desired shape of the whole assembly 10 and the resulting beam shape.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting assembly including:
   a leadframe stamped out of a metal sheet material, the leadframe comprising at least a first leadframe part and a second leadframe part having a separation between them, wherein:
      the first leadframe part comprises:
         a first flat portion;
         a first inclined section bent at a first edge; and
         a second inclined section bent at a second edge opposite the first edge, the first and the second inclined sections being longitudinally offset from each other; and
      the second leadframe part comprises:
         a second flat portion;
         a third inclined section bent at the first edge and located opposite the second inclined section of the first leadframe part; and
         a fourth inclined section bent at the second edge, the third and the fourth inclined sections being longitudinally offset from each other;
   a plurality of spaced LED elements fixed to the leadframe and bridging the first leadframe part and the second leadframe part, each of the plurality of spaced LED elements comprising a packaging with at least a first contact tab and a second contact tab wherein the first contact tab comprises a contact surface arranged on and connected to the first flat portion, and wherein the second contact tab comprises a contact surface arranged on and connected to the second flat portion;

wherein the plurality of spaced LED elements forms the only electrical connection between said first leadframe part and said second leadframe part;

wherein the plurality of spaced LED elements is disposed to emit light when operated; and wherein the first, the second, the third, and the fourth inclined sections form light direction sections including reflective surfaces arranged to reflect light emitted from the plurality of spaced LED elements.

2. The lighting assembly according to claim 1, wherein the metal sheet material is bent and thereby configured to form the light direction sections.

3. The lighting assembly according to claim 1, wherein the light direction sections are shaped such that at least 10% of the light emitted from each of the plurality of spaced LED elements is reflected at the reflective surfaces.

4. The lighting assembly according to claim 3, wherein the light direction sections are formed such that more than 50% of the light emitted from each of the plurality of spaced LED elements is reflected at the reflective surfaces.

5. The lighting assembly according to claim 1, wherein the leadframe comprises at least a first and a second reflective surface arranged on opposite sides of each of the plurality of spaced LED elements.

6. The lighting assembly according to claim 1, wherein the reflective surfaces have a reflectivity above 50%.

7. The lighting assembly according to claim 6, wherein the reflective surfaces are diffusely reflective.

8. The lighting assembly according to claim 1, wherein a reflective surface of said reflective surfaces is a colored surface.

9. The lighting assembly according to claim 1, wherein the leadframe is fixed to a carrier.

10. The lighting assembly according to claim 1, wherein the second flat portions are arranged at least substantially in a plane, and wherein the light direction sections of the leadframe are inclined to the plane.

11. A lamp for a motor vehicle including an assembly according to claim 1.

* * * * *